United States Patent

Bennett et al.

Patent Number: 5,976,764
Date of Patent: Nov. 2, 1999

[54] WATER-LESS LITHOGRAPHIC PLATES

[75] Inventors: Peter Andrew Reath Bennett, Harrogate; Carole-Anne Smith, Leeds, both of United Kingdom

[73] Assignee: Kodak Polychrome Graphics LLC, Norwalk, Conn.

[21] Appl. No.: 08/793,142

[22] PCT Filed: Aug. 3, 1995

[86] PCT No.: PCT/GB95/01846

§ 371 Date: May 5, 1997

§ 102(e) Date: May 5, 1997

[87] PCT Pub. No.: WO96/05539

PCT Pub. Date: Feb. 22, 1996

[30] Foreign Application Priority Data

Aug. 11, 1994 [GB] United Kingdom ............... 9416204

[51] Int. Cl.$^6$ ....................................................... G03F 7/00
[52] U.S. Cl. ........................ 430/303; 430/309; 101/451; 101/452; 101/465; 101/466
[58] Field of Search ..................................... 430/303, 309; 101/451, 452, 465, 466

[56] References Cited

U.S. PATENT DOCUMENTS

| | | | |
|---|---|---|---|
| 3,907,562 | 9/1975 | Crystal | 430/303 |
| 3,910,187 | 10/1975 | Cords | 430/309 |
| 4,508,814 | 4/1985 | Sakurai et al. | 430/303 |

FOREIGN PATENT DOCUMENTS 2009250  1/1970  France.

*Primary Examiner*—Maria Nuzzolillo
*Assistant Examiner*—Laura Weiner
*Attorney, Agent, or Firm*—Ostrager Chong Flaherty & Onofrio

[57] ABSTRACT

There is described a method of preparing water-less lithographic plate which comprises imagewise exposing a lithographic plate coated with a photosensitive composition, processing the exposed plate in an aqueous based developing liquid to remove those areas of the photosensitive composition which are removable by the developing liquid, drying the plate and coating the plate with an ink releasing coating composition which adheres to those areas of the plate from which the photosensitive composition has been removed, but which does not adhere to those areas of the plate from which the photosensitive composition which has not been removed, further treating the plate to cure or fix the ink-releasing composition thus providing ink-receptive areas of the plate which are those areas of the plate from which the photosensitive composition which has not been removed in the developing liquid and ink-releasing areas of the plate which are covered with the cured ink-releasing composition. Both positive working and negative working lithographic plates can be used in this method to produce positive working water-less plates and negative working water-less plates.

9 Claims, No Drawings

WATER-LESS LITHOGRAPHIC PLATES

Lithographic plates may be divided into two classes. Those which require dampening water which is fed to the non-image areas of the plate, forms a water film and acts as an ink-repellant layer; this is the so-called fountain solution and those which require no fountain solution. These are called driographs or water-less lithographic plates. Most lithographic plates at present in use are of the first type and require a fountain-solution during printing. However, lithographic plates of this type suffer from a number of disadvantages. Some of these are:

a) Adjustment of the proper ink-water balance during press operation is difficult and requires great experience. If the correct ink-water balance is not achieved scumming is occasioned when the printed ink image extends into the non-image areas ruining the printed image.

b) Adjustment of the ink-water balance at start-up or re-start up is particularly difficult and can not be stabilised until a large number of sheets have been printed, thus incurring waste, c) The ink tends to become emulsified which leads to poor adherence of the ink on to the plate which causes problems in colour reproduction and in dot reproduction, d) The printing press has to be provided with a dampening system, thus increasing its size and complexity.

e) The plate care chemistry and fountain solutions require careful control and selection. Further, plate cleaners contain significant levels of solvent which is not desirable.

However, with water-less plates in which the ink-releasing layer is a cured silicone layer there is no scumming and clearer images can be produced. Very often water-less plates comprise a base material, often aluminium plate, on which a photosensitive layer is coated, on this photosensitive layer is coated a silicone layer. After imagewise exposure and development in which selected areas of the photosensitive composition are altered the overlying silicone layer is removed and the plate is inked up. The ink adheres only to those areas of the plate not covered by the silicone remaining after development. Thus the plate can be printed without the need to use a fount solution.

In some more recent patents relating to water-less lithographic plates a photosensitive layer is coated on to the base and an ink-releasing layer is coated on the photo-sensitive layer, for example U.S. Pat. No. 5,252,431. However, such an arrangement also suffers from photosensitive material/ink-releasing layer adhesion problems. Also the developer has to penetrate the irk-releasing layer in order to reveal the final printing image thus requiring the use of solvents.

However, in practice it has proved difficult to get the photosensitive composition to adhere to the silicone layer. In spite of the idea of water-less plates having been described in patent specifications for at least fifteen years very little has been done to commercialise the idea and the water-less plates which have been and are being sold are more expensive than conventional plates which require a fount solution.

In U.S. Pat. No. 3,910,187 there is described a method of preparing a water-less lithographic plate which comprises acting on an exposed but undeveloped negative working plate with a solvent developer which comprises a fluorine containing compound. In the areas which have been photo-hardened by exposure no development takes place but in the unexposed areas of the photosensitive composition the unexposed photosensitive composition is removed and the fluoro containing compound is deposited in its place. It is stated in U.S. Pat. No. 3,910,187 that a water-less plate is thus produced. However as a solvent developer is used which is stated in U.S. Pat. No. 3,910,187 to be a vaporisable solvent a health hazard is produced. Moreover some fluorine containing compound is likely t be deposited on the image areas of the plate during such solvent development. This will lead to poor image differentiation as the printing ink will be repulsed and developer will need to be regularly replenished.

It is the object of the present invention to provide a water-less lithographic plate in which a photosensitive layer is not coated on to a silicone layer and which does use a solvent-based developing solution.

According to the present invention there is provided a method of preparing water-less lithographic plate which comprises imagewise exposing a lithographic plate coated with a photosensitive composition, processing the exposed plate in an aqueous based developing liquid which comprises no vaporisable solvent, to remove those areas of the photosensitive composition which are removable by the developing liquid, optionally drying the plate and coating the plate with a water-based emulsion of an ink releasing coating composition which adheres to those areas of the plate from which the photosensitive composition has been removed, but which does not adhere to those areas of the plate from which the photosensitive composition which has not been removed, further treating the plate to cure or fix the ink-releasing composition thus providing ink-receptive areas of the plate which are those areas of the plate from which the photosensitive composition has not been removed in the developing liquid and ink-releasing areas of the plate which are covered with the cured ink-releasing composition.

According to one aspect of the method of the present invention there is provided a method of preparing a water-less negative working lithographic plate which comprises imagewise exposing a lithographic plate coated with negative working photosensitive composition to harden the photosensitive composition in the exposed areas, developing the plate in an aqueous based developing liquid which comprises no vaporisable solvent to remove the non-hardened areas, optionally drying the plate, coating the plate with a water-based emulsion of an ink-releasing coating composition which adheres to those areas of the plate from which the non-hardened photosensitive composition has been removed but which does not adhere to the hardened composition, further treating the plate to cure the ink releasing coating composition thus providing ink-receptive areas of the plate which are those areas of the plate which have been hardened during the imagewise exposure and ink-releasing areas of the plate which are those areas of the plate covered with the cured ink-releasing composition.

According to another aspect of the present invention there is provided a method of preparing a water-less positive working lithographic plate which comprises imagewise exposing a lithographic plate coated with a positive working photosensitive composition to alter the photosensitive composition in the exposed areas to render it removable in a developing liquid which comprises no vaporisable solvent, developing the plate in an aqueous based developing liquid, to remove the light-exposed areas of the plate, optionally drying the plate, coating the plate with a water-based emulsion of an ink-releasing coating composition which adheres to those areas of the plate from which the light-exposed photo-sensitive composition has been removed in the developing liquid but which does not adhere to the non-exposed areas of the plate, further treating the plate to cure the ink releasing composition, thus providing ink-receptive areas of the plate which are those areas of the plate covered with non-exposed photosensitive composition and ink-releasing areas of the plate covered with the cured ink-releasing composition. Preferably the ink-releasing composition is cured by heating.

With some photosensitive compositions in order to ensure that the ink-releasing coating composition does not adhere at all to the photosensitive composition left on the plate after development, this composition is treated with a substance or to a process which renders it more non receptive to the ink releasing coating composition. Alternatively the binder for the photosensitive composition may be chosen so that the image after exposure and development is more oleophilic than the norm. For example if the binder for the photosensitive composition comprises a mixture of cellulosic compounds then the incorporation of ethyl cellulose will render the image extremely oleophilic and thus more non-receptive to the ink-releasing coating composition. As with conventional plates further processing treatments are possible to, for example, extend run length by baking or irradiation.

Thus in the method of the present invention a conventional presensitised lithographic plate is used which after exposure and development is converted to a water-less lithographic plate which is inked-up and printed without the need to use a fountain solution.

Thus in the method of the present invention both a negative working water-less plate as well as a positive working water-less plate can be prepared. This is in contradistinction to the method described in U.S. Pat. No. 3,910,187 wherein only a negative working plate can be prepared. Further, in the method of the present invention it is possible to increase the oleophilicity of the exposed areas of the photosensitive layer by treatment of these areas after development but before the plate is coated with the ink-releasing coating composition.

Suitable ink-releasing compositions include fluorine based resins and silicones.

Commercially available fluorine resins are for example "ASAHI GUARD AG-710" (manufactured by Asahi Glass Co., Ltd), "ASAHI GUARD PA-550" (manufactured by Asahi Glass Co. Ltd), "DICGURARD F-60" (manufactured by Dainippon Ink and Chemicals, Inc.), "DICGURARD F-70" (manufactured by Dainippon Ink and Chemicals, Inc.) "SCOTCH GUARD FC-282" (manufactured by Sumitomo 3M), "ZEPEL B" and Zonyl TM (both manufactured by E.I. DuPont). Examples of the perfluoroalkyl-bearing monomer are (perfluoronynyl)ethyl acrylate, (perfluorononyl)ethyl methacrylate, (perfluoroisononyl)ethyl acrylate, (perfluoroisononyl)ethyl methacrylate, (perflurooctyl)ethyl acrylate, (perfluorooctyl)ethyl methacrylate, (perfluoroheptyl)ethyl acrylate, (perfluoroheptyl(ethyl methacrylate, etc. Examples of the other copolymerisable monomer which may be present include styrene, acrylonitrile, acrylic acid and methacrylic acid, and their esters such as alkyl esters (e.g. methyl ester, ethyl ester, propyl ester, butyl ester, isobutyl ester, 2-ethylhexyl ester, hexyl ester, decyl ester, lauryl ester, stearyl ester), hydroxyalkyl esters (e.g. β-hydroxyethyl ester) and glycidyl ester. The proportion of these monomers may be optionally selected, but the amount of the perfluoroalkyl-bearing monomer should be not less than 50% by weight on the basis of the amount of the entire monomers.

These fluorine resins are described in U.S. Pat. No. 4,508,814 to Nippon Paint which describes a process wherein a water-soluble photosensitive compound is used to prepare either a negative working plate or a positive working plate.

Suitable silicones for use in the present invention are described in for example U.S. Pat. No. 4,510,277, U.S. Pat. No. 3,865,588, U.S. Pat. No. 5,266,443 and U.S. Pat. No. 4,874,686.

Examples of useful silicone polymers are organo functional siloxanes. One such siloxane is available from Dow Corning as a 40% solids emulsion under the designation SYL OFF 7920.

Usefully a curing catalyst may be used in conjunction with the ink-releasing composition. For example, a platinum based catalyst marketed by Dow Corning under the designation SYL OFF 7922 may be used to cure SYL OFF 7920.

When the amount of ink-repellent release material is less than 50% by weigh the ink-repellent property of the printing plate as the ultimate product is inferior. The use of the other copolymerisable monomers may be effective in improving a close adherence between the support material and the photosensitive layer, as well as the storage stability of the photosensitive plate and, the wear-resistance of the printing plate.

A mixture of fluorine resin and silicone may be used. Preferably more fluorine resin than silicone is used.

In one method of the present invention the surface of an aluminium plate is anodised to produce a surface layer of partially hydrolysed aluminium oxide.

Depending on the optical sensitivity of the photosensitive composition the imagewise exposure may be a contact exposure, a projection exposure or an exposure in an image setter to an electromagnetic radiation or heat source, typically a scanning laser.

The lithographic plate coated with a photosensitive composition may have any negative or positive working photosensitive composition thereon.

Examples of such compositions are:(A)

(A) Photopolymerisable Light-Sensitive Resin Layers.

Light-sensitive resin layers formed from a photopolymerisable light-sensitive composition which comprises (i) a monomer or oligomer having an olefinically; unsaturated double bond, (ii) an optional polymeric compound having a film-forming ability and (iii) a photopolymerisation initiator;

Light-sensitive resin layers obtained from a light-sensitive composition comprising the foregoing components (i) to (iii) can be used provided that it comprises a polymeric compound formed by coupling the components (i) and (ii), i.e., a composition containing a polymer photopolymerisable or photocrosslinkable olefinically unsaturated double bonds on the side chains and a film-forming ability instead of the components (i) and (ii); and Light-sensitive resin layers obtained from a light-sensitive composition comprising the polymeric compound formed by coupling the components (i) and (ii) defined above and a monomer or oligomer (i) as defined above. The latter is more preferably used in the present invention.

A suitable aqueous based developer to develop resins of this type is an aqueous solution which comprises 15% benzyl alcohol 5% β-napthyl ethoxylate 2% $NTA_3$ (chelating agent)

(B) Compositions Comprising Photohardenable Diazo or Azido Resin,

Examples of the photohardenable diazo resin include zinc chloride complex salts of condensates of diazo amines such as p-diazodiphenyl-amine, p-diazomonoethylaniline and p-diazobenzyl ethylaniline with formaldehyde.

This light-sensitive resin layer essentially differs from those exemplified in (A) in that it does not comprise any compound having a photopolymerisable unsaturated double bond.

Examples of photohardenable azido compounds include azidophthalate and azidobenzoate esters of polyvinyl alcohol and esters of styrene-maleic anhydride copolymer with aromatic azidoalcohols such as β-(4-azidophenol)ethanol.

A suitable aqueous based developer to develop resins of this type is:

4.8% sodium di-isopropyl naphthalene sulphonate
3.5% benzyl alcohol
2.15% sodium sulphite
1.7% trisodium citrate (C) Compositions Comprising o-Quinone Diazide Compounds:

Examples of particularly preferred o-quinone diazide compounds are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430, 3,102,809; 3,106,465; 3,635,709 and 3,647,443 and these compounds may preferably be used in the invention. Among these, particularly preferred are o-naphthoquinonediazidosulfonates or o-naphthoquinone-diazidocarboxylates of aromatic hydroxyl compounds; o-naphthoquinonediazidosulfonic acid amides or o-naphthoquinone-diazido-carboxylic acid amides of aromatic amine compounds, for instance, esters of benzoquinone-1,2-diazidosulfonic acid or naphthoquinone-1,2-diazidosulfonic acid with polyhydroxyphenyl (hereinafter the term "ester" also include partial esters); esters of naphthoquinone-1,2-diazido-4-sulfonic acid or naphthoquinone-1,2-diazido-5-sulfonic acid with pyrogallol/acetone resins; esters of benzoquinone-1,2-diazidosulfonic acid or naphthoquinone-1,2-diazidosulfonic acid with novolak type phenol/formaldehyde resins or novalak type cresol/formaldehyde resins; amides of poly(p-aminostyrene) and naphthoquinone-1,2-diazido-4-sulfonic acid or naphthoquinone-1,2-diazido-5-sulfonic acid; esters of poly(p-hydroxystyrene) and naphthoquinone-1,2-diazido-5-sulfonic acid; esters of polyethylene glycol with naphthoquinone-1,2-diazido-4-sulfonic acid or naphthoquinone-1,2-diazido 5-sulfonic acid: amides of polymeric amines with naphthoquinone-1,2-diazido-4-sulfonic.

Suitable aqueous base developers to develop these diazide compounds are.

Aqueous solution of 8% metasilicate, 0.1% of an organic phosphite ester of an ethoxylated alcohol and 0.01% of polyoxy propylene methyl ethyl ammonium chloride.

(D) Photosensitive silver halide layers as described for example in E.P. 131462, U.S. Pat. No. 4,859,290, U.S. Pat. No. 4,603,100 and U.S. Pat. No. 3,822,127.

Suitable aqueous developing solutions include hydroquinone and metol based developing solutions.

The accompanying Example will serve to illustrate the present invention.

EXAMPLE 1

Three Craftsman E presensitised lithographic plates marketed by Horsell Graphic, Industries were used.

These plates comprise a grained aluminium plate coated with a diazo photosensitive coating. They are negative working.

The three plates were imagewise exposed in a contact printer to light from a mercury-halogen discharge lamp filtered through a hard U.V. filter.

The plates were then developed in a developing solution which comprised an aqueous solution of benzyl alcohol, an alkyl sulphonate surfactant, trisodium citrate and sodium sulphite.

Plate 1 was then inked-up, placed in a printing press and a fountain solution which is commercially available under the trade name of Emerald Fount by Anchor Chemicals was then played on the plate. One hundred prints were then run off. Some scumming of the image was noticed at the end of the printing run.

Plate 2 was then inked-up, placed in a printing press but no fountain solution was used. No prints could be obtained.

Plate 3 was lightly inked and then dried. An ink-releasing emulsion which comprised 66 parts by volume of SYLOFF 7920, 17 parts by volume of SYL OFF 7922 and 17 parts by volume of water were then applied to the printing surface of the plate by a roller. This emulsion was then cured by heating the plate for 30 seconds at 100° C. After this cure the plate was rubbed lightly to remove any ink-releasing emulsion which was present on the printing image. The printing-image was then inked up and placed in a printing press. One hundred prints were run off. Each print was visually perfect with no scumming visible even at the end of the run.

EXAMPLE 2

A Capricorn positive working plate marketed by Horsell Graphic Industries was used. These plates comprise a grained aluminium base coated with a naphthoquinonediazido based photosensitive coating. The plate was imagewise exposed in a contact printer to light from a mercury-halogen discharge lamp filtered through a U.V. filter.

The plate was then developed in an aqueous solution of 8% metasilicate, 0.1% of an organic phosphite ester of an ethoxylated alcohol and 0.01% of polyoxy propylene methyl ethyl ammonium chloride.

The plate was inked up with Rapid Ink which renders the exposed area of the plate from which the photosensitive composition had been removed more receptive to an ink-releasing composition.

After drying the plate was then coated with a silicone emulsion consisting of 5 g SYL-OFF 7920, 1 g SYL-OFF 7922 and 4 g water using a non-wired bar. The plate was then dried at 150° C. for one minute. After this cure the printing plate was inked-up using water-less ink and placed in a printing press. Three hundred positive prints were run-off. Each was visually perfect with no scumming even at the end of the run.

Rapid Ink is a commercially available product.

EXAMPLE 3

A Capricorn positive working plate as used in Example 2 was exposed developed angst inked as in Example 2.

After drying the plate was coated with a 1:1 mixture by weight of SYL-OFF 7920 7 parts, SYL-OFF 7922 1 part and 2 parts of water together with the fluorine resin Zonyl 8070. This mixture was coated on the plate with a non-wired bar and dried at 150° C. for 1 minute to cure the composition. After this cure the printing plate was inked-up using water-less ink and placed in a printing press. Three hundred positive prints were run-off. Each was visually perfect with no scumming even at the end of the run.

We claim:

1. A method of preparing a water-less lithographic plate which comprises:
    (i) imagewise exposing a lithographic plate precursor coated with a photosensitive composition;
    (ii) processing the exposed plate in an aqueous based developing liquid which comprises no vaporisable organic solvent to remove those areas of the photosensitive composition which are removable by the developing liquid; optionally drying the plate;
    (iii) coating the plate with a water-based emulsion of an ink releasing coating composition which adheres to those areas of the plate from which the photosensitive composition has been removed, but which does not adhere to those areas of the plate from which the photosensitive composition has not been removed; and
    (iv) further treating the plate to cure or fix the ink-releasing composition; thus providing ink-receptive areas of the plate which are those areas of the plate from which the photosensitive composition has not been removed in the developing liquid and ink-releasing areas of the plate which are covered with the cured ink-releasing composition.

2. A method according to claim 1 wherein a water-less negative working lithographic plate is prepared which comprises:
    (i) imagewise exposing a lithographic plate coated with negative working photosensitive composition to harden the photosensitive composition in the exposed areas;
    (ii) developing the plate in an aqueous based developing liquid which comprises no vaporisable organic solvent to remove the non-hardened areas; optionally drying the plate;
    (iii) coating the plate with a water-based emulsion of an ink-releasing coating composition which adheres to those areas of the plate from which the non-hardened photosensitive composition has been removed but which does not adhere to the hardened composition; and
    (iv) further treating the plate to cure the ink releasing coating composition; thus providing ink-receptive areas of the plate which are those areas of the plate which have been hardened during the imagewise exposure and ink-releasing areas of the plate which are those areas of the plate covered with the cured ink-releasing composition.

3. A method according to claim 1 of preparing a water-less positive working lithographic plate which comprises:
    (i) imagewise exposing a lithographic plate coated with a positive working photosensitive composition to alter the photosensitive composition in the exposed areas to render it removable in a developing liquid;
    (ii) developing the plate in an aqueous based developing liquid which comprises no vaporisable organic solvent to remove the light-exposed areas of the plate; optionally drying the plate;
    (iii) coating the plate with a water-based emulsion of an ink-releasing coating composition which adheres to those areas of the plate from which the light-exposed photo-sensitive composition has been removed in the developing liquid but which does not adhere to the non-exposed areas of the plate; and
    (iv) further treating the plate to cure the ink releasing composition; thus providing ink-receptive areas of the plate which are those areas of the plate covered with non-exposed photosensitive composition and ink-releasing areas of the plate covered with the cured ink-releasing composition.

4. A method according to claim 1 wherein step (iv) the plate is heated to cure the ink-releasing composition.

5. A method according to claim 1 wherein after development of the plate and before coating of the ink-releasing composition the remaining image is coated with a substance which renders the image more non-receptive to the ink-releasing composition.

6. A method according to claim 1 wherein after development of the plate and before coating of the ink-releasing composition the plate is processed to render the image more non-receptive to the ink-releasing composition.

7. A method according to claim 1 wherein the ink-releasing composition comprises a silicone based polymer.

8. A method according to claim 7 wherein a curing catalyst is used together with the silicone based polymer.

9. A method according to claim 1 wherein the ink-releasing composition is a fluorine containing substance.

* * * * *